United States Patent [19]
Ota

[11] Patent Number: 5,699,230
[45] Date of Patent: Dec. 16, 1997

[54] ELECTRIC CIRCUIT DEVICE AND IGNITION APPARATUS FOR INTERNAL COMBUSTION ENGINE USING THE SAME

[75] Inventor: Etsuo Ota, Anjo, Japan

[73] Assignee: Nippondenso Co., Ltd., Kariya, Japan

[21] Appl. No.: 620,358

[22] Filed: Mar. 22, 1996

[30] Foreign Application Priority Data

May 15, 1995 [JP] Japan .................. 7-115417

[51] Int. Cl.$^6$ .................. H05K 5/04; H05K 5/06
[52] U.S. Cl. .......... 361/736; 361/816; 361/818; 123/146.5 B; 123/643
[58] Field of Search ............... 361/816, 818, 361/736; 123/643, 146.5 B

[56] References Cited

U.S. PATENT DOCUMENTS

| | | | |
|---|---|---|---|
| 4,567,317 | 1/1986 | Ehrlich et al. | 174/35 |
| 5,113,840 | 5/1992 | Taruya et al. | 123/644 |
| 5,125,386 | 6/1992 | De Filippis et al. | 123/634 |
| 5,206,796 | 4/1993 | Thompson et al. | 361/424 |
| 5,359,982 | 11/1994 | Taruya | 123/634 |
| 5,381,159 | 1/1995 | Oohori | 345/163 |
| 5,550,713 | 8/1996 | Pressler et al. | 361/818 |
| 5,566,052 | 10/1996 | Hughes | 361/704 |

FOREIGN PATENT DOCUMENTS

| | | |
|---|---|---|
| 48-90151 | 10/1973 | Japan . |
| 51-25760 | 2/1976 | Japan . |
| 55-68292 | 5/1980 | Japan . |

OTHER PUBLICATIONS

Nippondenso Technical Disclosure Journal Serial No. 65-220 May 15, 1989.

*Primary Examiner*—Michael W. Phillips
*Assistant Examiner*—David Foster
*Attorney, Agent, or Firm*—Nixon & Vanderhye P.C.

[57] ABSTRACT

An electric circuit device, such as an igniter for internal combustion engine ignition systems, has a metallic package which is floated from the electric ground, and an electric circuit which is formed by conductive patterns and circuit elements mounted on a ceramic substrate. Another conductive pattern is formed as a guard pattern along an outer periphery of the substrate and electrically grounded. The protective film is formed in a comb shape on the guard pattern, exposing the guard pattern only partly. The exposed guard pattern located close to the metallic package absorbs electric noises coming in through the metallic package.

23 Claims, 4 Drawing Sheets

ELECTRIC CIRCUIT DEVICE AND IGNITION APPARATUS FOR INTERNAL COMBUSTION ENGINE USING THE SAME

BACKGROUND OF THE INVENTION

1. Field of the Invention

The present invention relates to an electric circuit device and an engine ignition apparatus using the same and, more particularly, to an improved electric circuit device such as an igniter circuit having a guard pattern for reducing susceptibility to incoming electric noises in an engine ignition system.

2. Description of Related Art

Various anti-noise electric circuit devices have been proposed. In one such device ("Printed Circuit Board Pattern for Protecting Electronic Devices from Incoming Noises" published in JOURNAL OF NIPPONDENSO TECHNICAL DISCLOSURE, Ser. No. 65-220, of May 15, 1989), a guard pattern which is part of the conductive patterns of an electric circuit is formed on an outer peripheral portion of a printed circuit board. The electronic or electric circuit which is to be protected from high voltage noises, e.g., surge voltages, and a protective film is formed on the guard pattern. The protective film on the guard pattern is removed partly to expose the guard pattern. This enables the surge voltages to jump into the exposed portions of the guard pattern, resulting in protection of the electric circuit.

It sometimes occurs, however, that a part of the guard pattern exposed by removal of the protective film peels off in the course of manufacturing processes because it is formed on the outer peripheral surface of the printed circuit board and more likely to be touched by jigs and the like used in the course of manufacturing. This will degrade the high voltage noise absorbing function of the conductive guard pattern.

In an coil-igniter integral module coil-igniter for an internal combustion engine in which an ignition coil and an igniter (electric circuit) are integrated, a ceramic substrate on which the electric circuit is formed is encased within a metallic package, and the metallic package is electrically connected to the specified portion of the electric circuit on the ceramic substrate to promote heat transfer function and anti-noise operation. This electrical connection, however, necessitates connection space and an increase in the number of manufacturing processes, which results in increases in size and cost of the coil-igniter module.

SUMMARY OF THE INVENTION

It is a primary object of the present invention to provide an electric circuit device which is less susceptible to incoming noises.

It is another object of the present invention to provide an ignition device for an internal combustion engine which is less susceptible to incoming noises.

It is another object of the present invention to provide an electric circuit which is highly durable and, less costly while maintaining less susceptibility to incoming high voltage noises.

According to the present invention, an electric circuit device has a metallic package which is floated from the electric ground. An electric circuit is mounted on a ceramic substrate and the substrate is encased within the metallic package. An electrically grounded guard pattern is formed on the substrate along an outer periphery of the substrate. A nonconductive protective film covers the guard pattern exposing partly the guard pattern. The protective film prevents the guard pattern from peeling off and the partly exposed guard pattern absorbs electric noises coming in through the nongrounded metallic package.

Preferably, the protective film is formed in a comb shape so that the guard pattern between adjacent comb teeth may be exposed.

More preferably, circuit elements of the electric circuit are located away from the peripheral or side edge of the substrate by a distance substantially equal to or more than one half of each comb tooth width.

BRIEF DESCRIPTION OF THE DRAWINGS

Other objects, features and advantages of the present invention will become more apparent from the following description when read with reference to the accompanying drawings, in which.

DETAILED DESCRIPTION OF A PRESENTLY PREFERRED EMBODIMENT

The present invention will be described in more detail with reference to an embodiment applied to integral coil-igniter module of an ignition apparatus for internal combustion engines.

Figure 1:
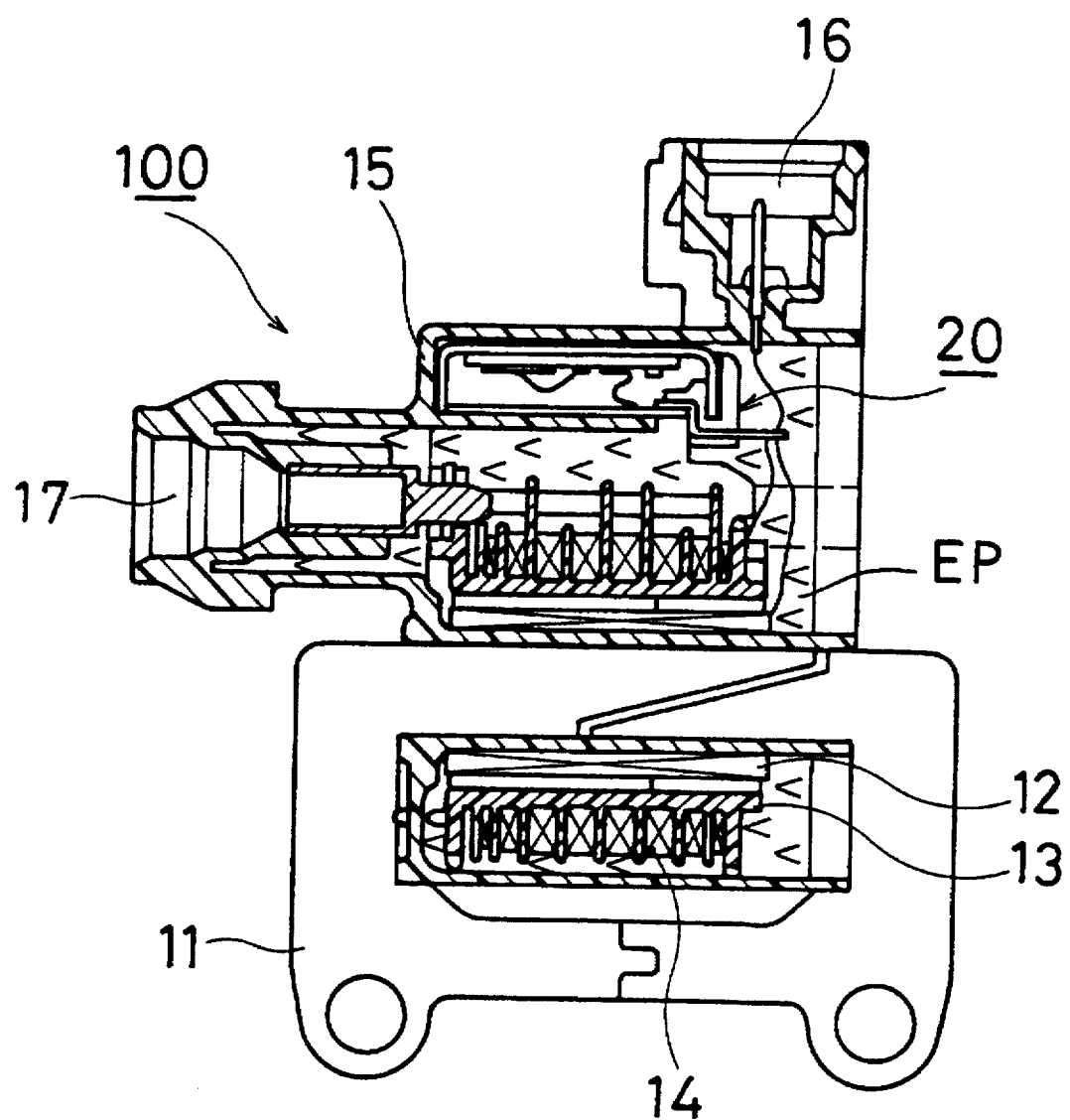
FIG. 1 is a cross-sectional view illustrating an embodiment of an integral module coil-igniter for an internal combustion engine according to the present invention.

In FIG. 1, an integral module coil-igniter 100 for an internal combustion engine ignition system (not shown) includes a core 11 made of a ferro magnetic material, a primary winding 12, a secondary winding 14 wound around a resin spool 13, and an igniter 20 including an electric circuit. These component parts are encased in a resin casing 15 formed with a primary connector 16 for connection with a battery and an electronic control unit (not shown) and a secondary connector 17 for connection with high-tension cords to sparking plugs. After electrically connecting the windings 12, 13, connectors 16, 17 and igniter 20, an electrically insulating epoxy resin EP is filled into the resin casing 15.

Figure 2:
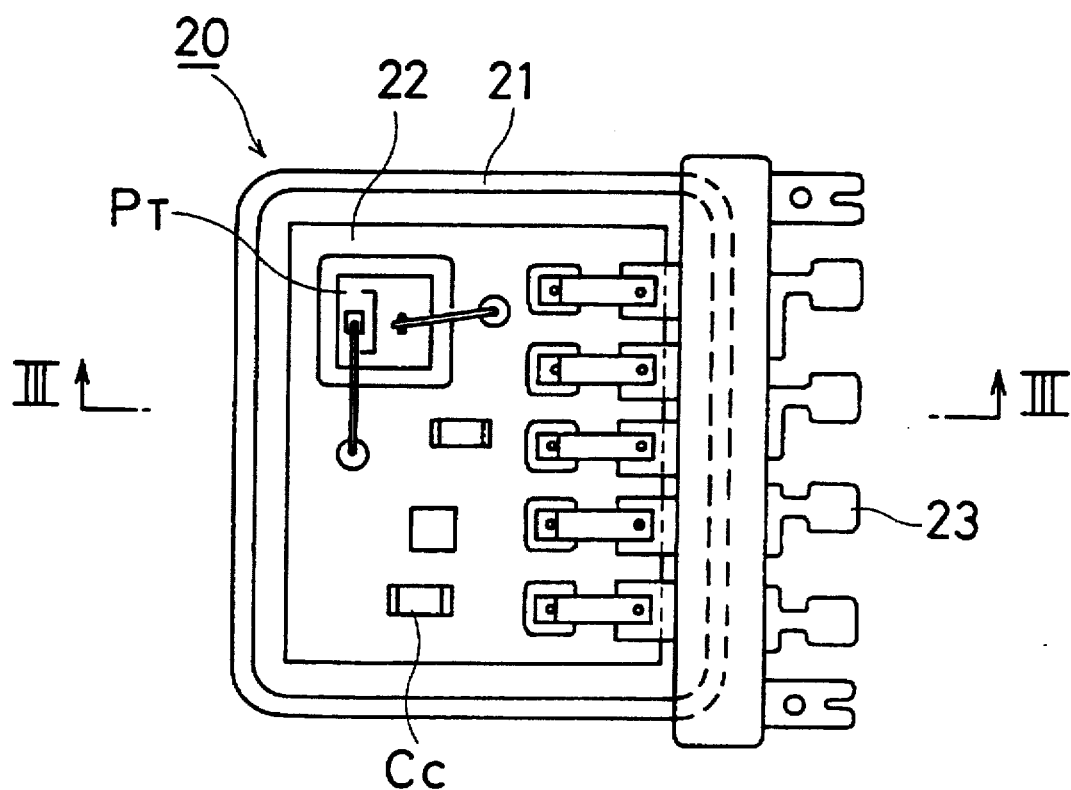
FIG. 2 is a plan view illustrating an igniter encased within the integral coil-igniter module illustrated in FIG. 1.
Figure 3:
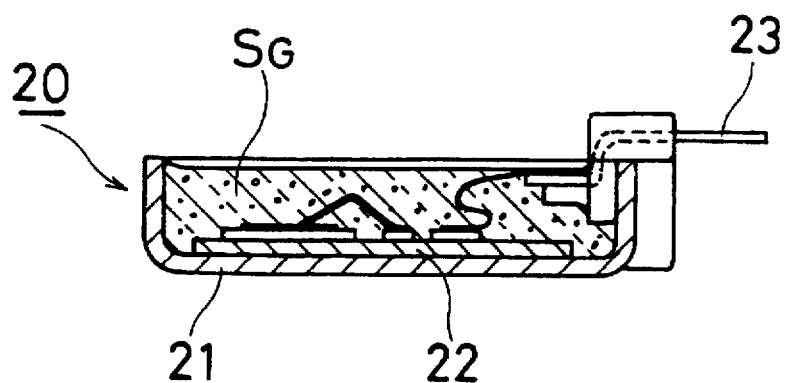
FIG. 3 is a cross-sectional view illustrating the integral coil-igniter integral module, the cross section being taken along the line III—III in FIG. 2.

As shown in FIGS. 2 and 3, the igniter 20 has a package 21 with a metallic bottom which is electrically floated from the electric ground, i.e., not electrically grounded. A ceramic board substrate 22 on which an electric igniter circuit is formed is attached fixedly to the bottom of the package 21 by an adhesive. The circuit connects to electric terminals 23 through electric leads. Various electric circuit elements such as a chip capacitor CC and a semiconductor power transistor PT are mounted on the substrate 22 to form the electric circuit together with electric conductive patterns on the substrate 22. A silicon gel SG fills a space in the package 21 to cover the electric circuit and protect the circuit from the outside environment.

Figure 4:
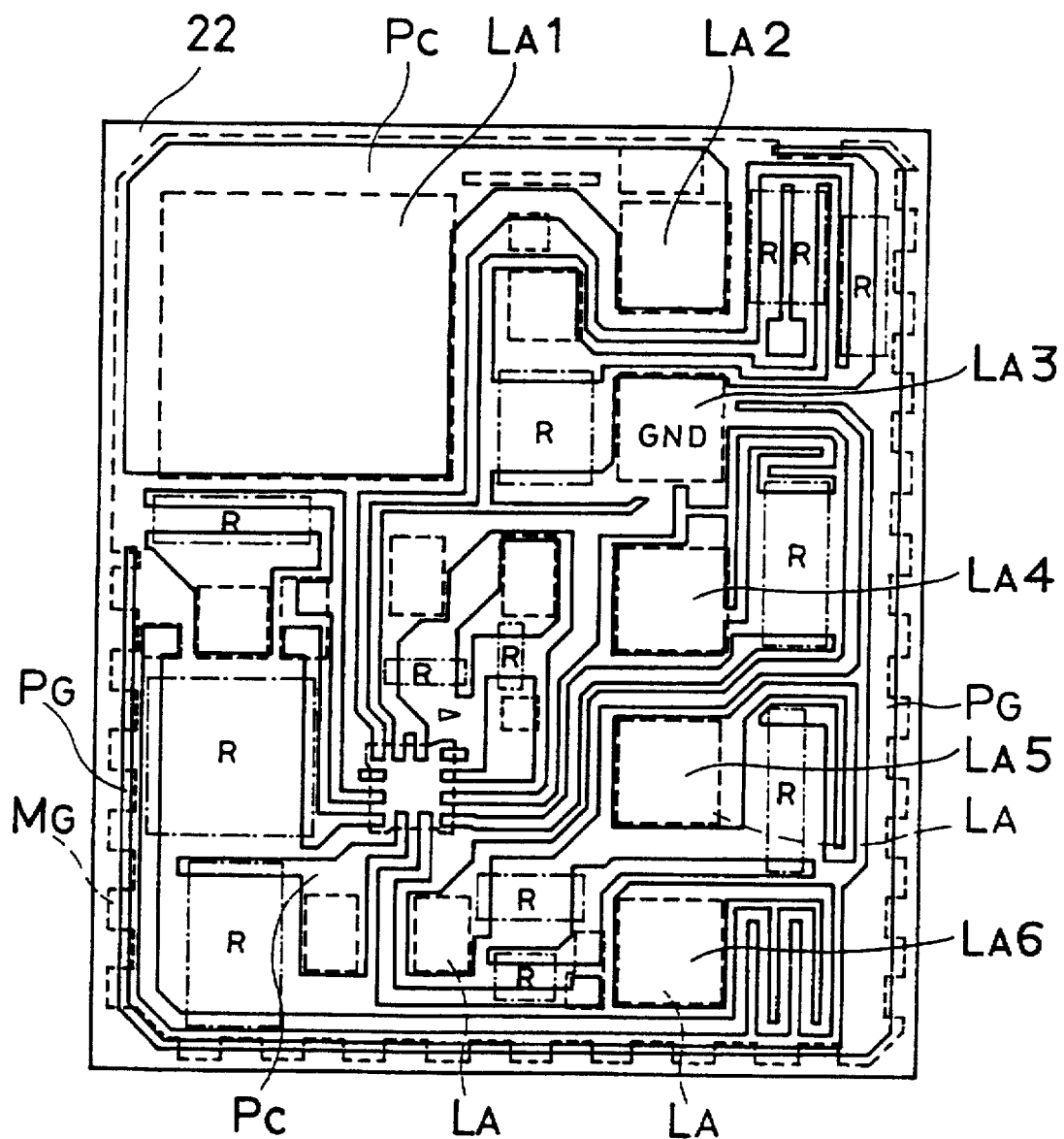
FIG. 4 is a plan view illustrating detailed conductive patterns and the like of an electric circuit on a ceramic substrate constituting the igniter illustrated in FIG. 2.

The electric circuit on the substrate 22 is formed as shown in FIG. 4. The conductive patterns PC functioning partly also as a guard pattern PG is formed first on the substrate 22 as shown by the solid line in the figure. Thick film resistors R shown by the dot-and-chain line are formed next. Thereafter, an electric insulating protective or masking film MG, e.g., glass layer, is formed as shown by the dotted line in the figure with its outermost or outer peripheral configuration being in a comb shape having comb teeth extending outwardly. The protective film MG is not formed on the inner areas surrounded by the dotted lines so that the inner conductive patterns PC also are partly exposed or not covered. Thus, the exposed inner conductive patterns provide a plurality of conductive lands LA (LA1 through LA6 and so on) to which the circuit elements and electric terminals are connected by reflow soldering.

It is to be noted that an outermost part of the conductive patterns PC electrically connected to the electric grounding portion GND (LA3) is used as the guard pattern PG. The guard pattern PG extends along an outer periphery of the substrate 22 except for areas where some circuit elements (e.g., collector terminal of the power transistor PT on the land LA1 in the exemplary embodiment) having high resistivity to surging voltages (electric noises) are mounted. Thus, the guard pattern PG is located closely to the inside wall surface of the metallic package 21. Since the protective film MG is formed in a comb shape with the comb teeth lying on the guard pattern PG, the guard pattern PG between the comb teeth is exposed partly and regularly.

As described above, the power transistor PT which turns the primary current to the ignition coil (primary winding 12 in FIG. 1) on and off is mounted on the land LA1 located at one corner of the substrate 22. The guard pattern PG is formed along the outer periphery of the substrate 22 except for such locations as the land LA1, substantially surrounding the electric circuit on substrate 22. The lands LA2 through LA6 located inside the guard pattern PG are connected to external electric terminals 23. Due to the electric connection of the guard pattern PG to the land LA3 to which the ground potential is applied, the guard pattern PG formed closely to the inside wall of the metallic package 21 effectively absorbs high voltage surge noises which would otherwise come in through the metallic package 21 to the electric circuit along the surface of substrate 22.

Figure 5A:
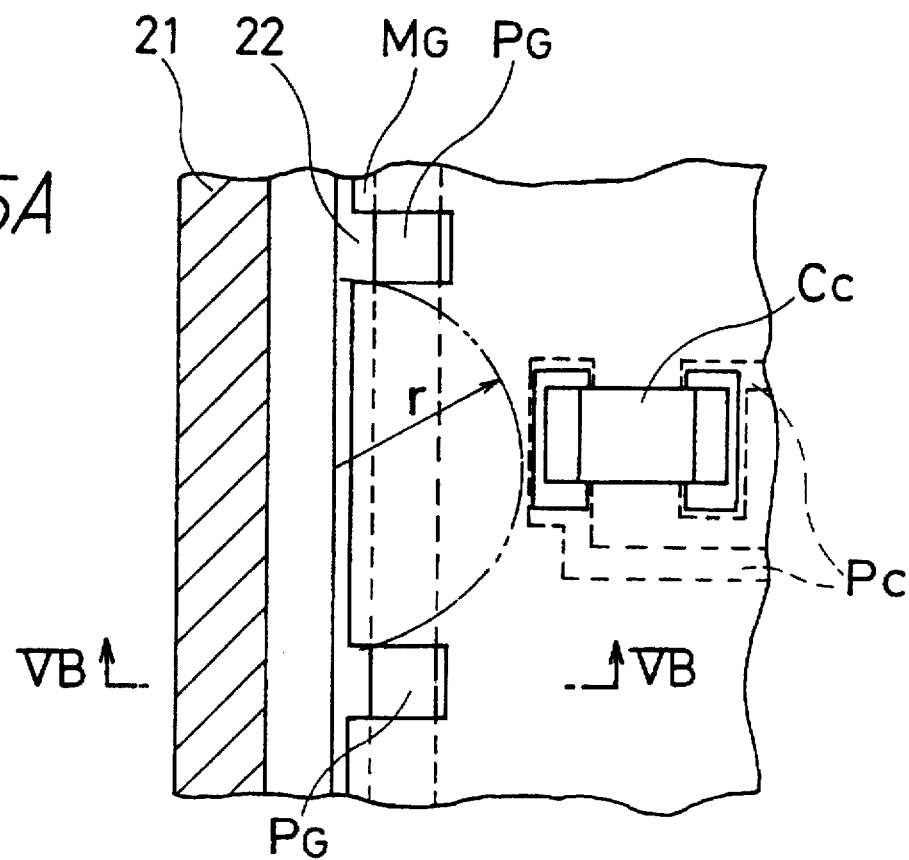
FIGS. 5A and 5B are schematic views illustrating a part of the electric circuit on the ceramic substrate bonded onto a bottom of a metallic package and a cross sectional view of the electric circuit, respectively, the cross section of FIG. 5B being taken along the line VB—VB in FIG. 5A.
Figure 5B:
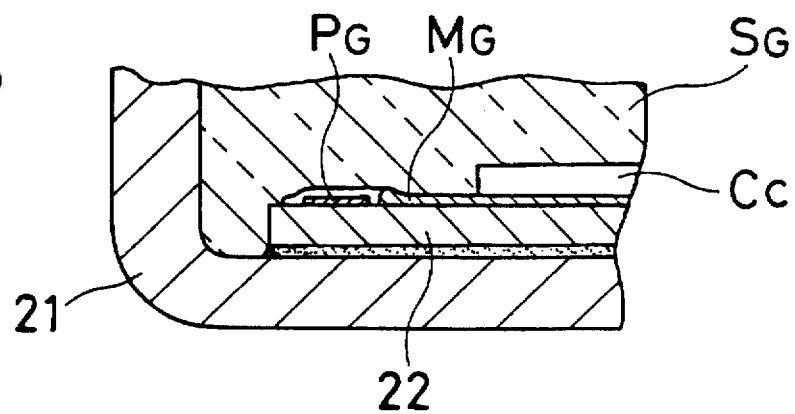

In more detail, as shown in FIGS. 5A and 5B, circuit elements such as the chip capacitor CC and any conductive portion connected therewith are disposed inside the guard pattern PG away from the inside wall surface of the metallic package 22. That is, those noise-susceptible portions on the substrate 22 are located away from the peripheral or side edge of the substrate 22 by more than a distance "r" which corresponds to the radius of an imaginary circle (two-dot-and-chain line in FIG. 5A) having its center on the peripheral edge of the substrate 22 and covering generally one tooth width of the protective film portion MG between two adjacent exposed guard pattern portions PG. This means that the noise-susceptible circuit elements are not directly exposed within an area existing from the substrate peripheral edge by less than one half distance of the comb tooth width, i.e., spacing (2r) between the two adjacent exposed guard portions PG.

In the ideal case where the surface of the electric circuit on the substrate 22 is fully covered by the silicon gel SG, the high voltage noises may break into the silicon gel SG existing at the shortest distance portion between the metallic package 21 and the exposed guard pattern PG. Air voids existing in the silicon gel SG, however, are likely to remain on the surface of the substrate 22. Since those voids have less resistivity to voltage than the silicon gel SG, the high voltages may break into those voids, affecting the electric circuit if any is present there at. With the above-described positional relation between adjacent pairs of the partly exposed portions of the guard pattern PG and the noise-susceptible electric circuit elements, the high voltage noises can be absorbed by the guard pattern PG wherever the voids may exist near the noise-susceptible.

Thus, the guard pattern PG which is a part of the conductive patterns PC is formed on the outermost portion of the substrate 22, i.e., as closely to the metallic package wall as possible while maintaining the required distance from the peripheral edge of the substrate 22. The metallic package 21 is not electrically connected to the grounding land LA 3 but is kept in the electrically floating condition. As a result, even when surging voltages or electric noises generated in the engine ignition system are applied to the metallic package 21, those noises can be absorbed into the guard pattern PG not masked by the protective film MG and will not affect noise-susceptible circuit elements, e.g., chip capacitor CC, disposed sufficiently inside the guard pattern.

Further, according to the exemplary embodiment described above, since the guard pattern PG is exposed only partly from the protective film MG, it can be prevented from peeling off from the substrate 22 in the course of manufacturing processes.

The present invention having been described should not be restricted to the disclosed exemplary embodiments but may be modified in various ways without departing from the spirit of the invention. For instance, the protective film need not be in the comb shape as long as the guard pattern is exposed in repetition by windows in the protective mask. Further, the guard pattern may be formed along the entire outer periphery of the substrate.

What is claimed is:

1. An electric circuit device comprising:
    an electric circuit board having an electrically grounding portion; electrically conductive patterns formed on the circuit board;
    an electrically insulating protective film formed on the conductive patterns;
    electric circuit elements mounted on the circuit board and forming an electric circuit together with the conductive patterns;
    the conductive patterns including a guard pattern connected to the grounding portion of the circuit board;
    the guard pattern being arranged between the circuit elements to be protected and a noise source; and
    the protective film being formed in a comb shape having comb teeth to expose the guard pattern between adjacent pairs of the comb teeth.

2. An electric circuit device as in claim 1, further comprising:
    a metallic package encasing the circuit board therein and being electrically floated from said grounding portion of the circuit board.

3. An electric circuit device as in claim 2, wherein:
    the metallic package has a bottom fixedly attached to the circuit board; and
    the guard pattern is formed along an outer periphery of the circuit board.

4. An electric circuit device as in claim 3, further comprising:
    a filler disposed in the metallic package.

5. An electric circuit device as in claim 4, wherein:
    the distance between a position mid-way between a pair of comb teeth of the protective film on an outer peripheral edge of the circuit board and a closest exposed portion of the guard pattern is shorter than that from the same position and a closest one of the circuit elements on the circuit board that is most susceptible to incoming noises.

6. An electric circuit device as in claim 3, wherein:
    on a specified part of the outer periphery of the circuit board is mounted one element of the circuit elements which is less susceptible to incoming noises than other circuit elements; and the guard pattern ends near the specified part of the outer periphery.

7. An electric circuit device as in claim 6, wherein:
the one element less susceptible to incoming noises includes a semiconductor switching element which turns primary current to an ignition coil of an internal combustion engine ignition system on and off.

8. An electric circuit device as in claim 7, further comprising:
a casing encompassing the metallic package together with primary and secondary windings of the ignition coil; and
an electric insulator material filled into the casing.

9. An electric circuit device comprising:
an electric circuit board having an electrically grounding portion;
electrically conductive patterns formed on the circuit board;
electric circuit elements mounted on the circuit board and forming an electric circuit together with the conductive patterns;
a metallic package encasing the circuit board therein and being electrically floated from the grounding portion of the circuit board;
the conductive patterns including a guard pattern connected to the grounding portion of the circuit board; and
the guard pattern being formed along an outer periphery of the circuit board to generally surround the electric circuit.

10. An electric circuit device as in claim 9, wherein:
the metallic package has a bottom fixedly attached to the circuit board.

11. An electric circuit device as in claim 10; further comprising:
a filler disposed in the metallic package.

12. An electric circuit device as in claim 10, wherein:
on a specified part of the outer periphery of the circuit board is mounted one element of the circuit elements which is less susceptible to incoming noises than other circuit elements; and
the guard pattern ends near the specified part of the outer periphery.

13. An electric circuit device as in claim 12, wherein:
the one element less susceptible to incoming noises includes a semiconductor switching element which turns primary current to an ignition coil of an internal combustion engine ignition system on and off.

14. An electric circuit device as in claim 13, further comprising:
a casing encompassing the metallic package together with primary and secondary windings of the ignition coil; and
an electric insulator material filled into the casing.

15. An electric circuit device for use in an internal combustion engine ignition system having an igniter, the electric circuit device comprising:
a ceramic substrate;
electric conductive patterns formed on the substrate;
electric circuit elements mounted on the substrate and connected with the conductive patterns to provide the igniter;
a guard pattern formed on an outer periphery of the substrate to substantially surround the conductive patterns and the circuit elements and electrically grounded to absorb incoming electric noises therein, the guard pattern ending near a specified part of the outer periphery where one circuit element resistive to incoming electric noises is mounted;
a protective film covering a predetermined area on the substrate;
a metallic package encasing the substrate therein and electrically isolated from the guard pattern; and
a filler disposed in the metallic package to cover the substrate.

16. An electric circuit device as in claim 15, wherein:
the protective film is formed on the guard pattern in a comb shape having comb teeth to expose partly the guard pattern between adjacent pairs of the comb teeth.

17. An electric circuit device as in claim 16, wherein:
the circuit elements are located away from an outer peripheral edge of the substrate by at least substantially one half of a comb tooth width.

18. An electric circuit device for use in an internal combustion engine system having an electric circuit for an engine control, the electric circuit device comprising:
a ceramic substrate;
electric conductive patterns formed on the substrate;
electric circuit elements mounted on the substrate and connected with the conductive patterns to provide the electric circuit;
a guard pattern formed on an outer periphery of the substrate to substantially surround the conductive patterns and the circuit elements and electrically grounded to absorb incoming electric noises therein;
a protective film covering a predetermined area on the substrate and exposing the guard pattern only partly in repetition along the outer periphery of the substrate;
a metallic package encasing the substrate therein and electrically isolated from the guard pattern; and
the circuit elements being located away from an outer peripheral edge of the substrate by substantially at least one half of the distance between two adjacent exposed portions of the guard pattern.

19. An improved electric circuit board having a peripheral electrical noise guard shield conductor, said improvement comprising;
an electrical conductor formed on the circuit board to protect at least one circuit component mounted inwardly thereof from electrical discharge noise; and
a non-conductive protective layer disposed over said electrical conductor except for predetermined spaced-apart apertures in the protective layer which thus expose underlying portion of the electrical conductor to absorb electrical noise discharges thereinto.

20. An improved electric circuit board as in claim 19 wherein said apertures are regularly spaced apart at a pitch distance 2r.

21. An improved electric circuit board as in claim 20 wherein a noise susceptible circuit component to be protected by the electrical conductor is spaced inwardly away from an exposed portion of the electrical conductor by a distance of at least r.

22. An improved electric circuit board as in claim 21 wherein said electrical conductor is located proximate the periphery of at least part of the circuit board.

23. An improved electric circuit board as in claim 22 wherein said non-conductive protective layer is shaped in a comb-like structure with comb teeth directed outwardly towards a circuit board edge.

* * * * *